United States Patent
Kataoka et al.

(10) Patent No.: US 12,352,429 B2
(45) Date of Patent: Jul. 8, 2025

(54) LIGHT-EMITTING DEVICE AND IMAGE DISPLAY APPARATUS

(71) Applicant: SONY GROUP CORPORATION, Tokyo (JP)

(72) Inventors: Yusuke Kataoka, Tokyo (JP); Akira Ohmae, Tokyo (JP); Yusuke Oyama, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 0 days.

(21) Appl. No.: 18/578,180

(22) PCT Filed: Mar. 16, 2022

(86) PCT No.: PCT/JP2022/011848
§ 371 (c)(1),
(2) Date: Jan. 10, 2024

(87) PCT Pub. No.: WO2023/007823
PCT Pub. Date: Feb. 2, 2023

(65) Prior Publication Data
US 2024/0328595 A1    Oct. 3, 2024

(30) Foreign Application Priority Data

Jul. 30, 2021   (JP) ................... 2021-125301

(51) Int. Cl.
*F21V 7/06*     (2006.01)
*F21V 9/30*     (2018.01)
*F21Y 113/00*   (2016.01)

(52) U.S. Cl.
CPC .............. *F21V 7/06* (2013.01); *F21V 9/30* (2018.02); *F21Y 2113/00* (2013.01)

(58) Field of Classification Search
CPC ................................ F21V 7/06; F21V 9/30
See application file for complete search history.

(56) References Cited

U.S. PATENT DOCUMENTS

2008/0298059 A1*  12/2008  Schug ............. H10H 20/855
                                               257/E33.071
2011/0025190 A1*   2/2011  Jagt .............. H10H 20/855
                                                   313/499

(Continued)

FOREIGN PATENT DOCUMENTS

JP    2009-087596 A    4/2009
JP    2011-515846 A    5/2011

(Continued)

OTHER PUBLICATIONS

International Search Report and Written Opinion of PCT Application No. PCT/JP2022/011848, issued on May 31, 2022, 13 pages of ISRWO.

*Primary Examiner* — Evan P Dzierzynski
*Assistant Examiner* — Nathaniel J Lee
(74) *Attorney, Agent, or Firm* — CHIP LAW GROUP

(57) ABSTRACT

A light-emitting device of one embodiment of the present disclosure includes: a light source section including a surface light source; a light reflective film that covers a surface of the light source section and has one or more openings on a light outputting surface of the light source section; and a reflecting structure that is provided on side of the light outputting surface of the light source section and has one or more light reflecting surfaces around the one or more openings, the one or more light reflecting surfaces reflecting light outputted from the one or more openings in a predetermined direction.

16 Claims, 16 Drawing Sheets

(56) References Cited

U.S. PATENT DOCUMENTS

| | | | | |
|---|---|---|---|---|
| 2012/0250304 | A1* | 10/2012 | Harbers | ............... F21V 7/0008 |
| | | | | 362/231 |
| 2018/0059482 | A1* | 3/2018 | Li | .................... G02F 1/133603 |
| 2018/0123003 | A1* | 5/2018 | Sweegers | ............ H10H 20/856 |
| 2018/0166424 | A1 | 6/2018 | Sim et al. | |

FOREIGN PATENT DOCUMENTS

| | | |
|---|---|---|
| JP | 2014-511013 A | 5/2014 |
| JP | 2021-012251 A | 2/2021 |
| WO | 2010/044240 A1 | 4/2010 |
| WO | 2020/261997 A1 | 12/2020 |

* cited by examiner

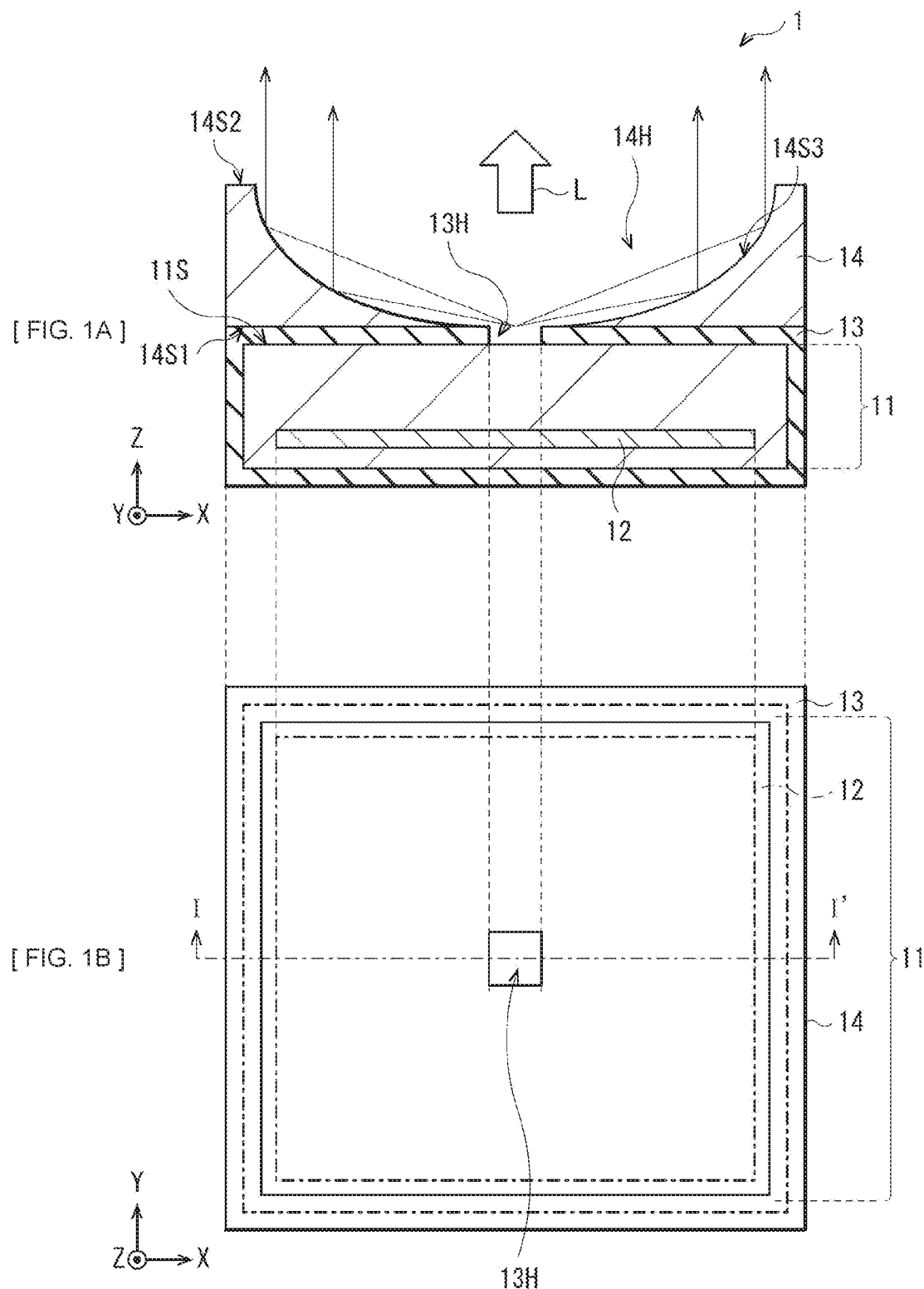

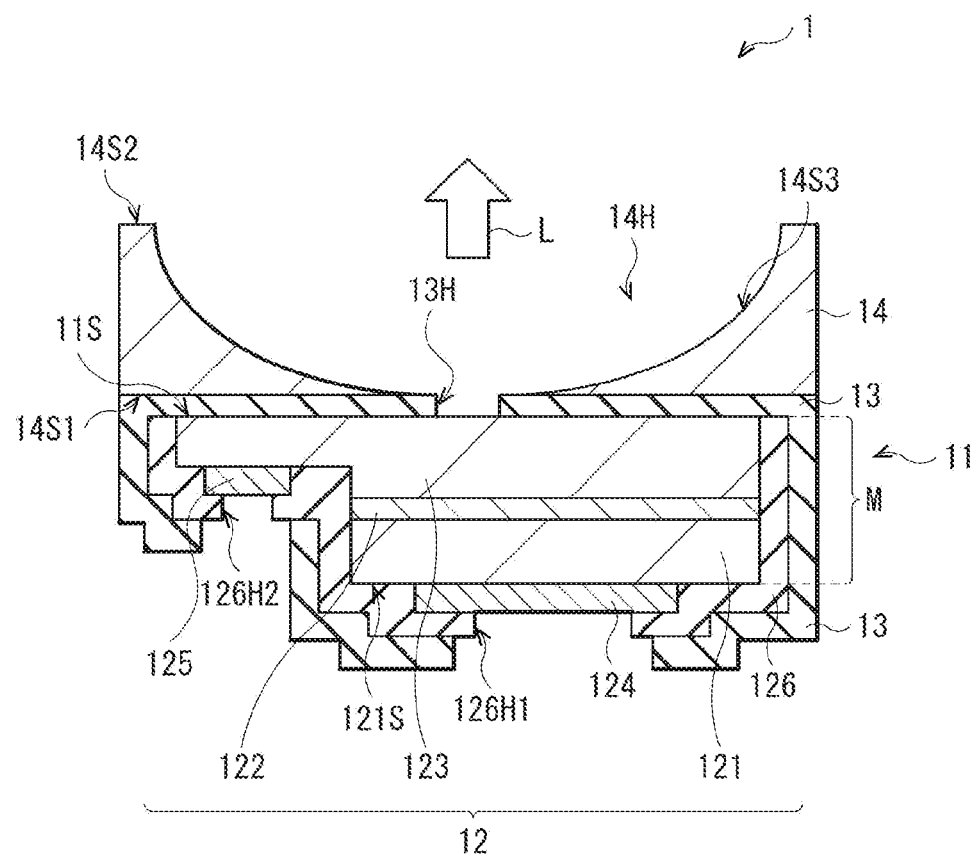
[FIG. 2]

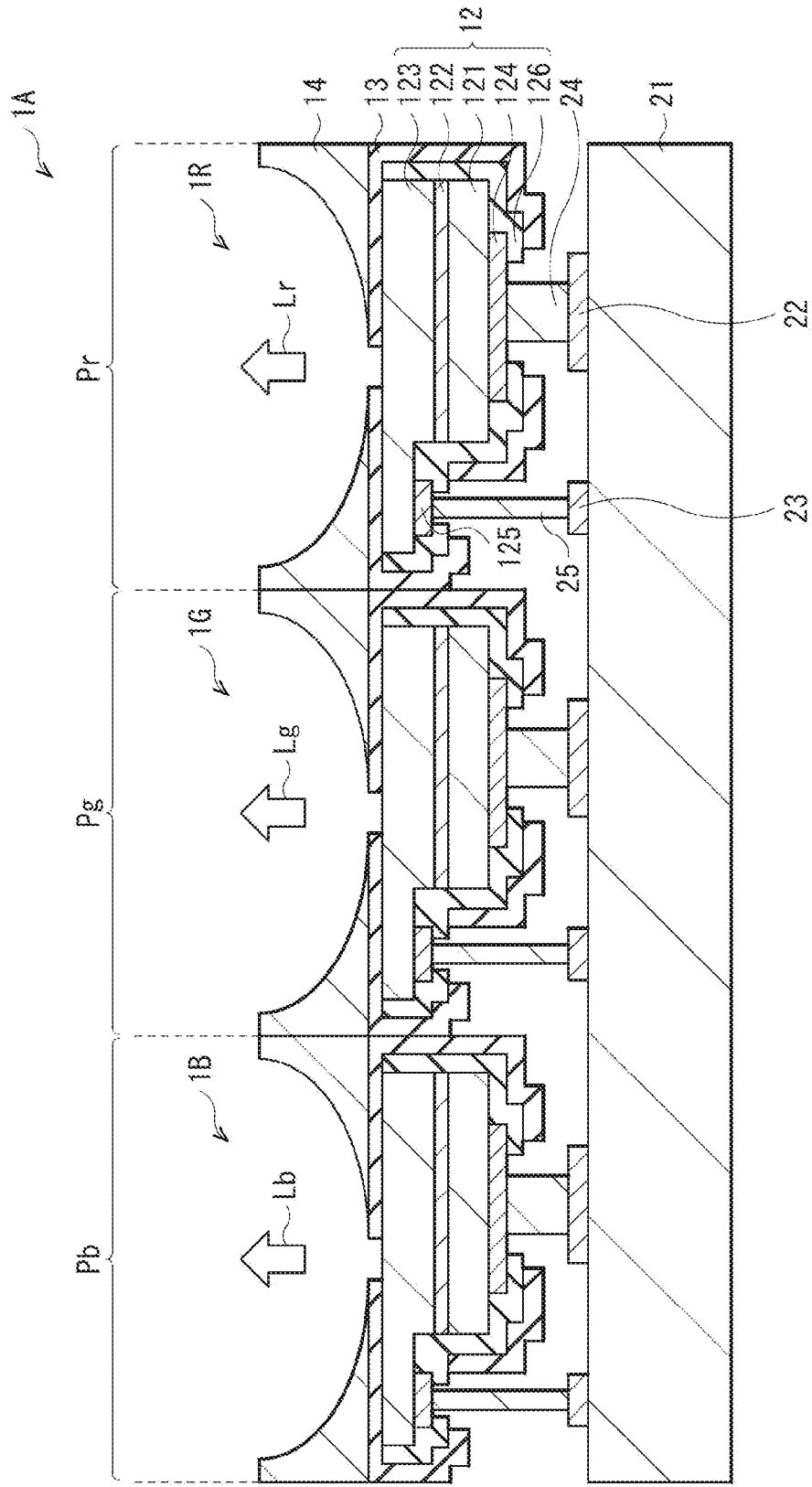
[FIG. 3]

[FIG. 4]
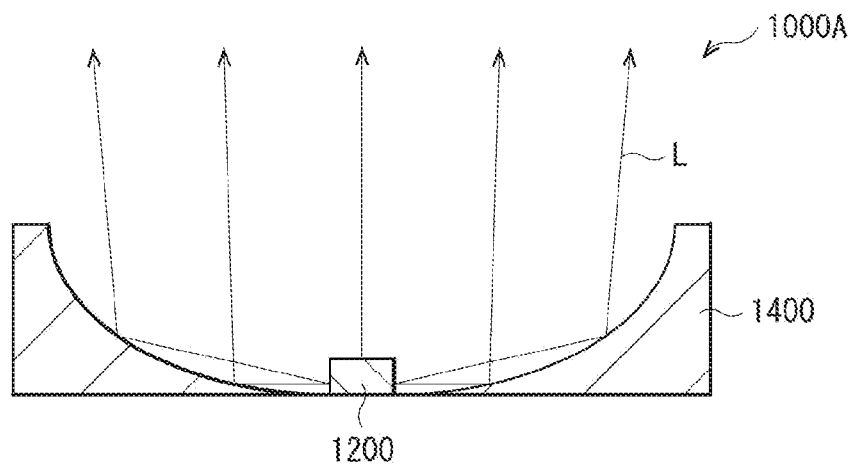
[FIG. 5]
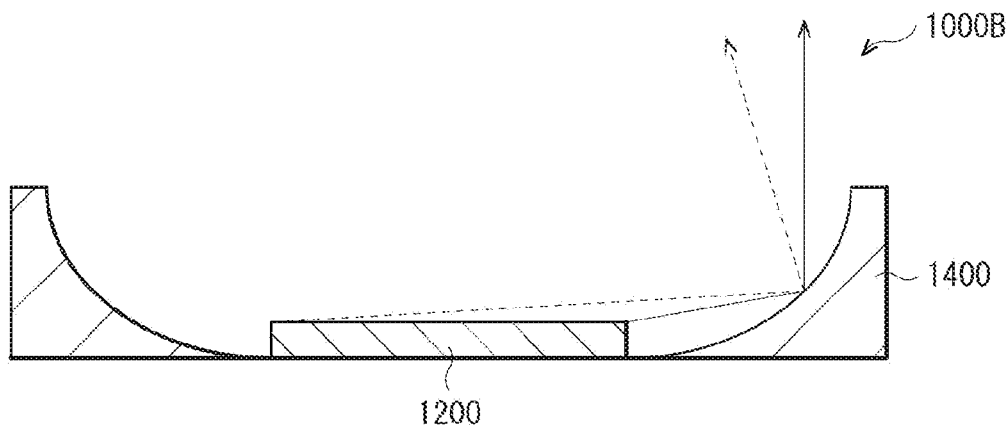
[FIG. 6]
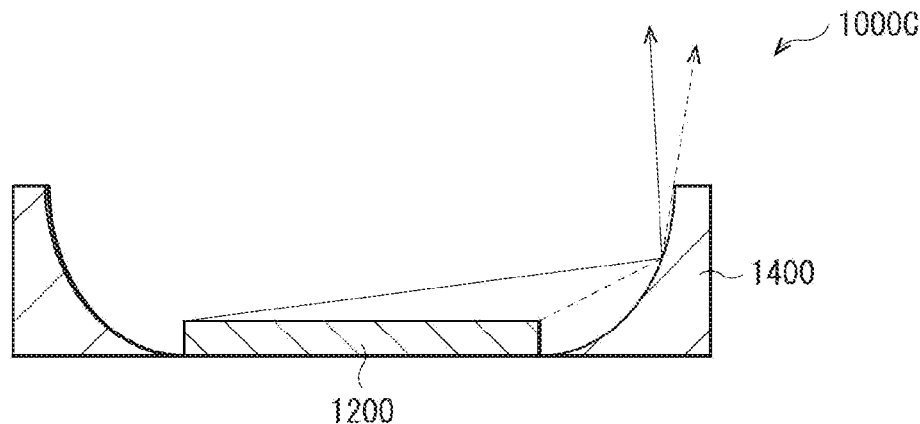

[ FIG. 7 ]
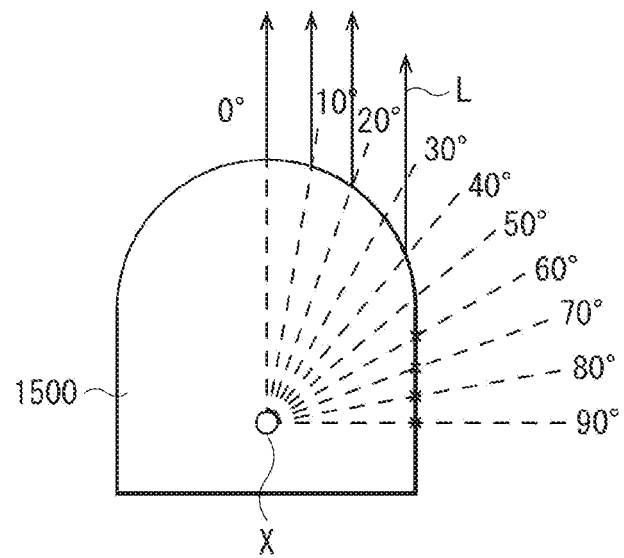
[ FIG. 8 ]
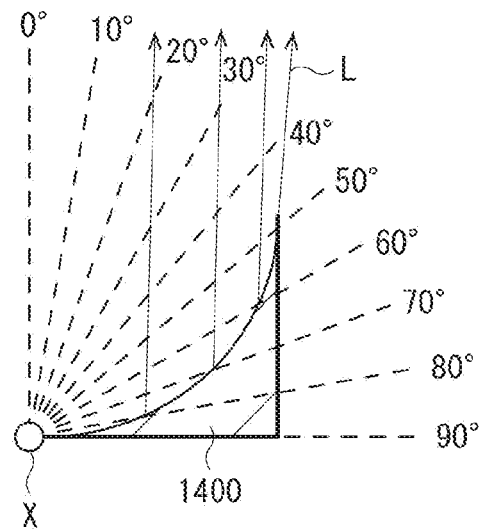

[FIG. 9]
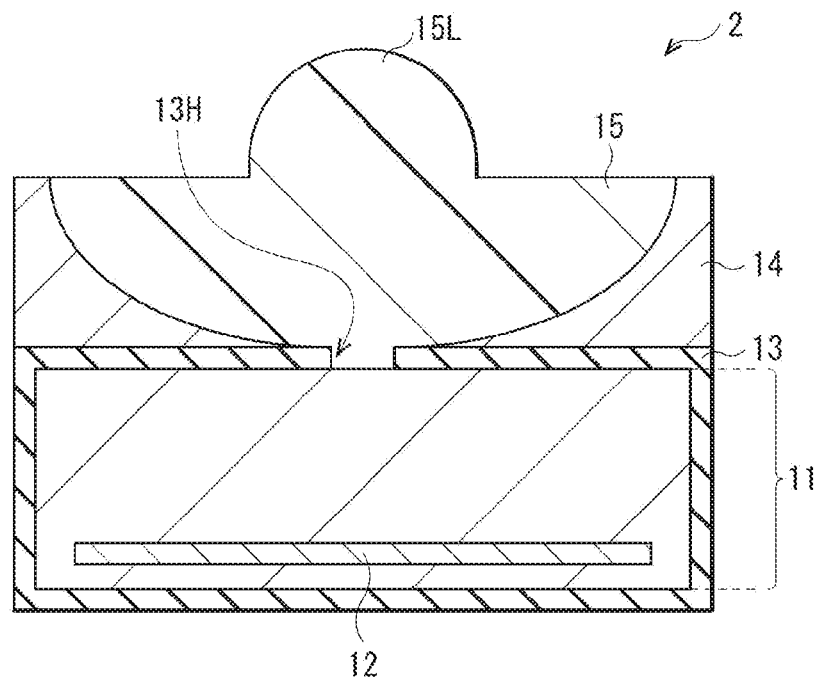
[FIG. 10]
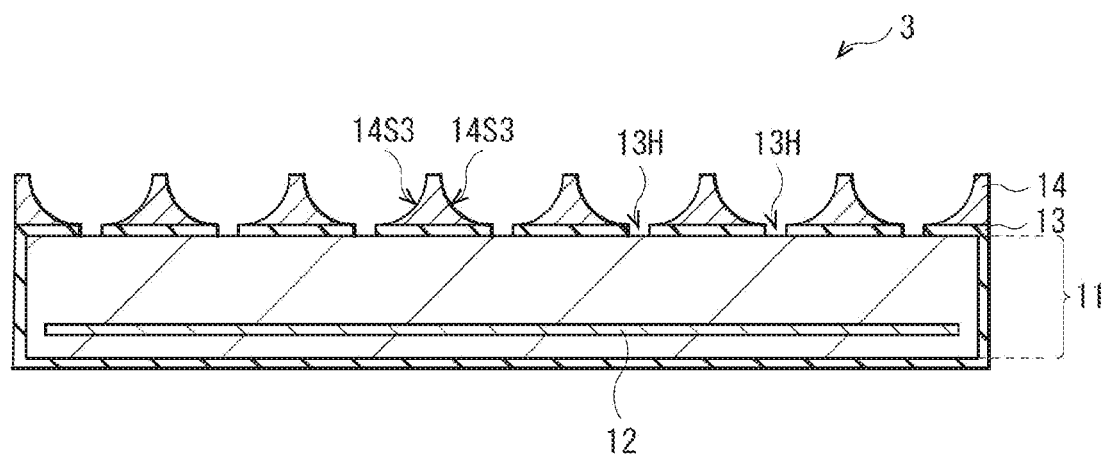

[FIG. 11]
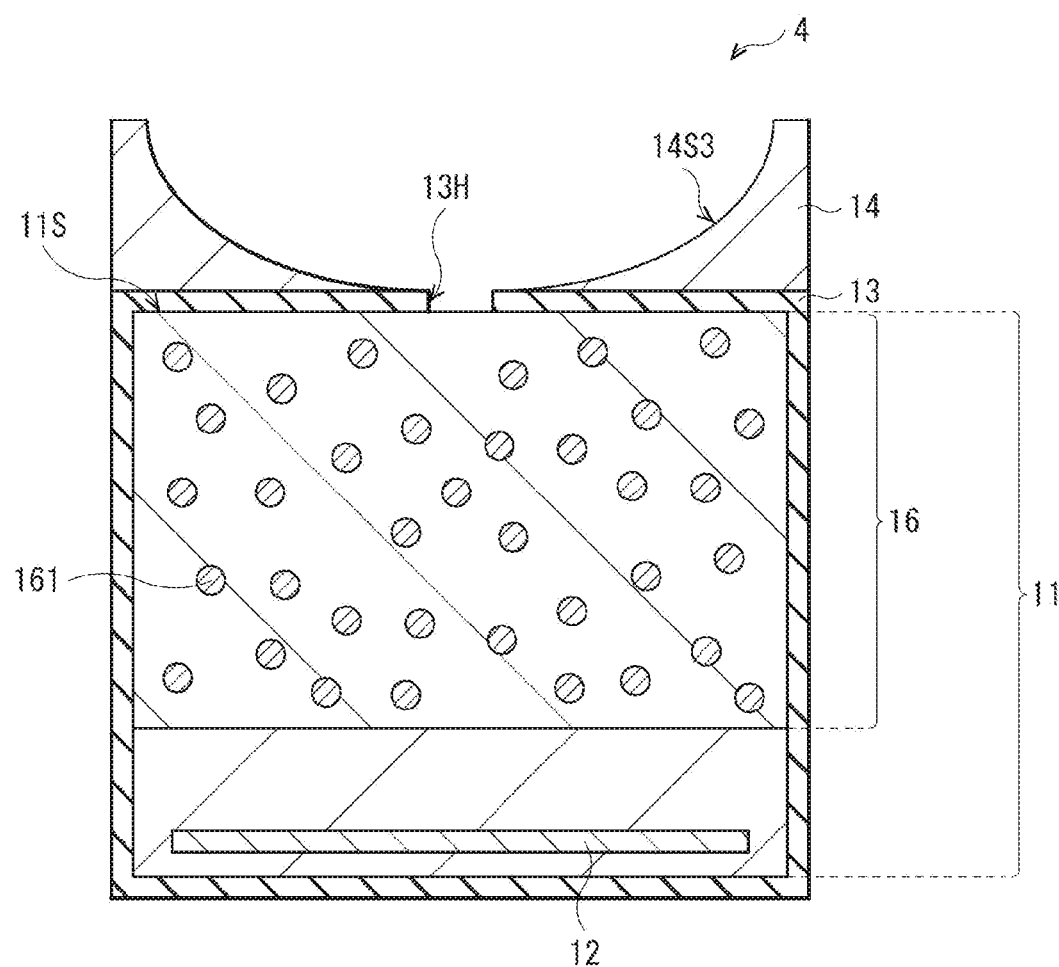

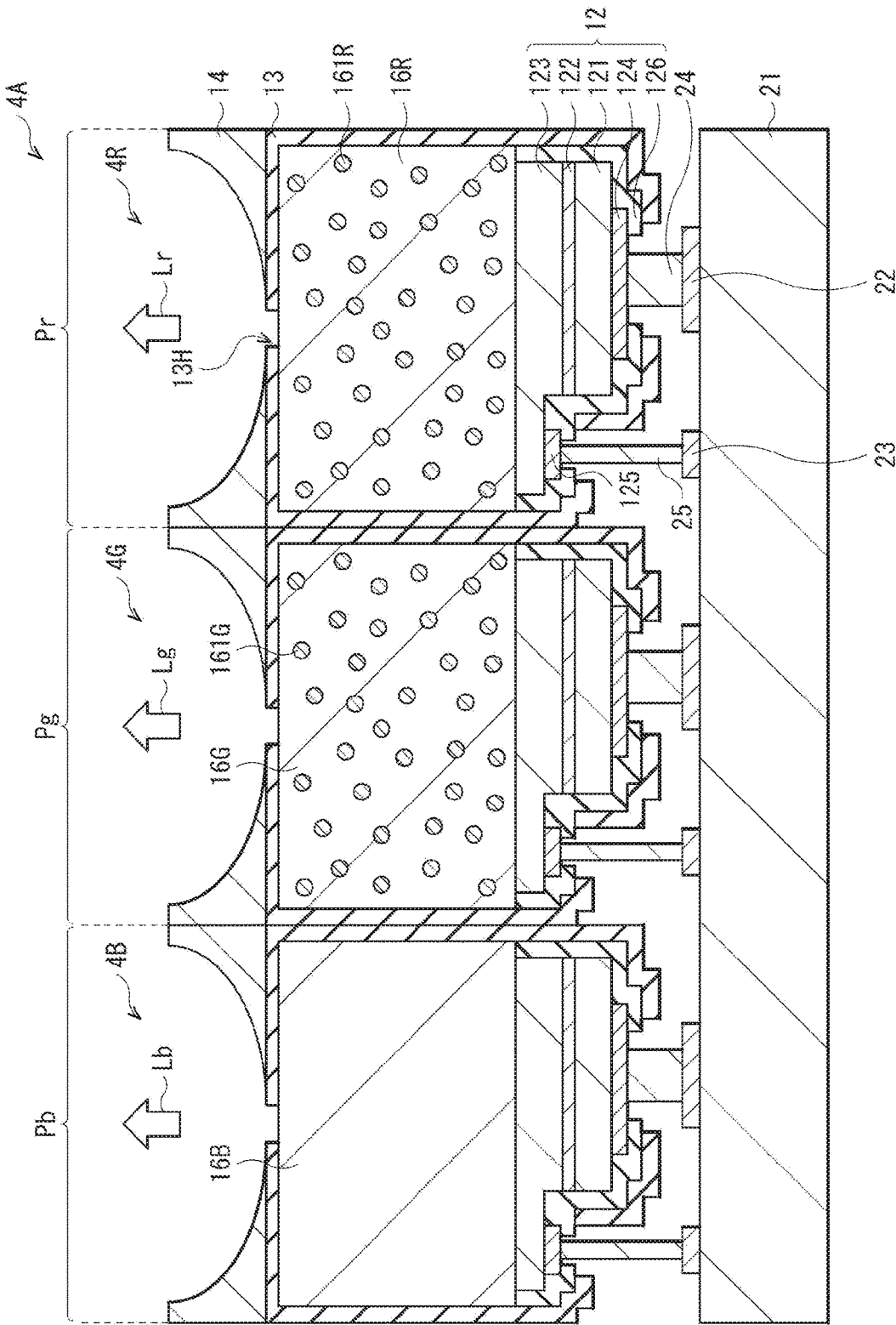
[FIG. 12]

[FIG. 13]
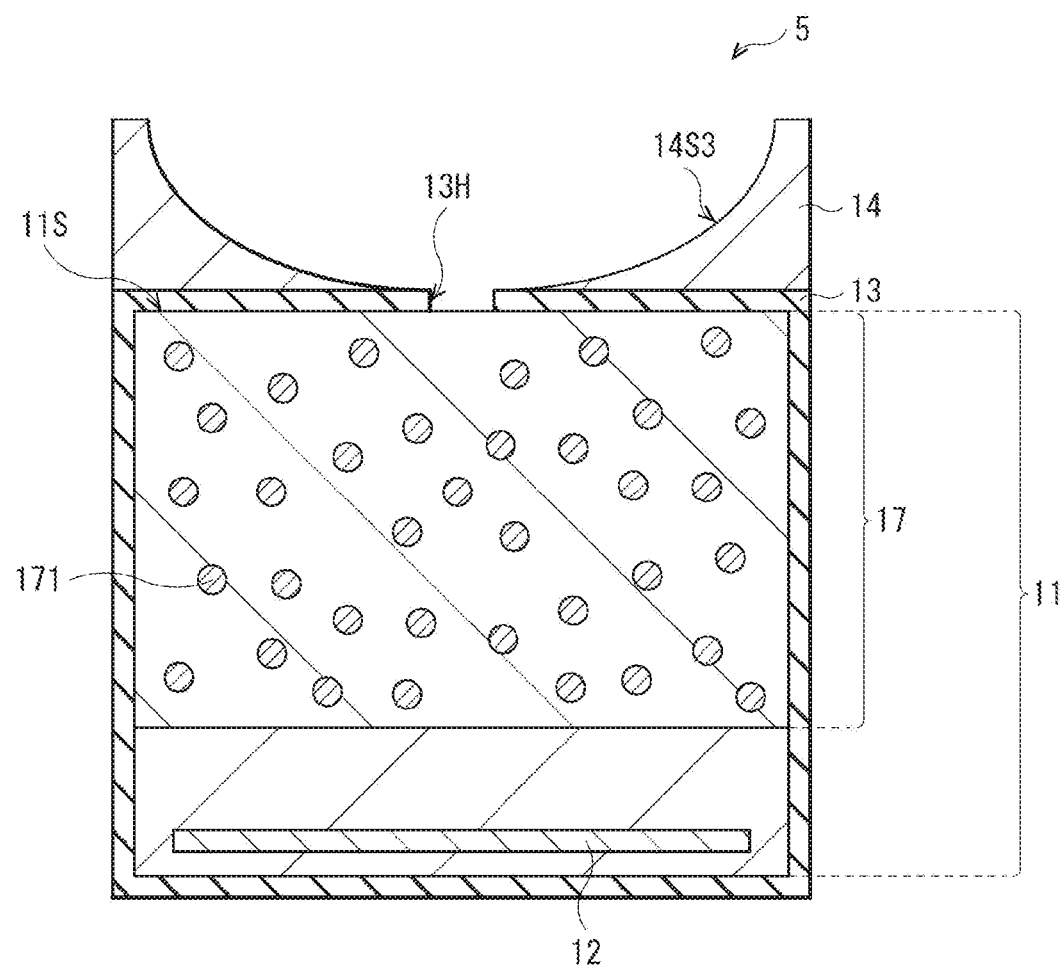

[FIG. 14]
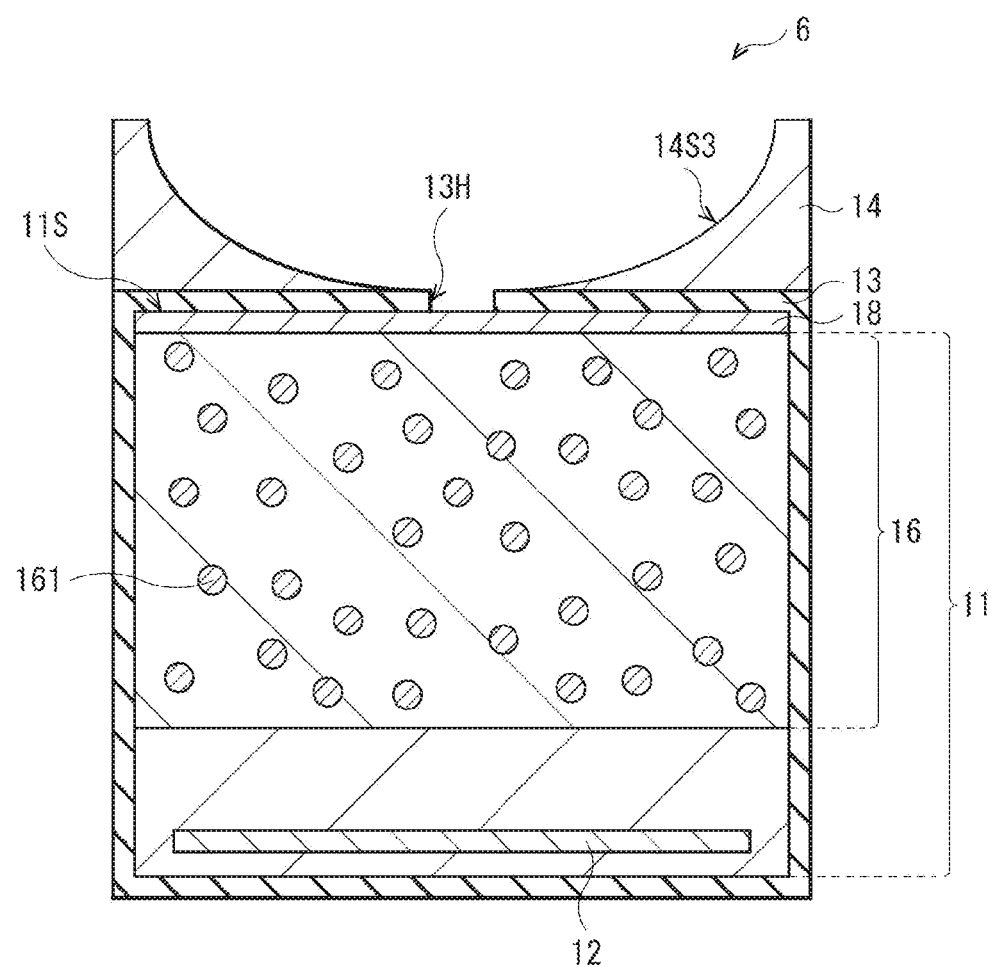

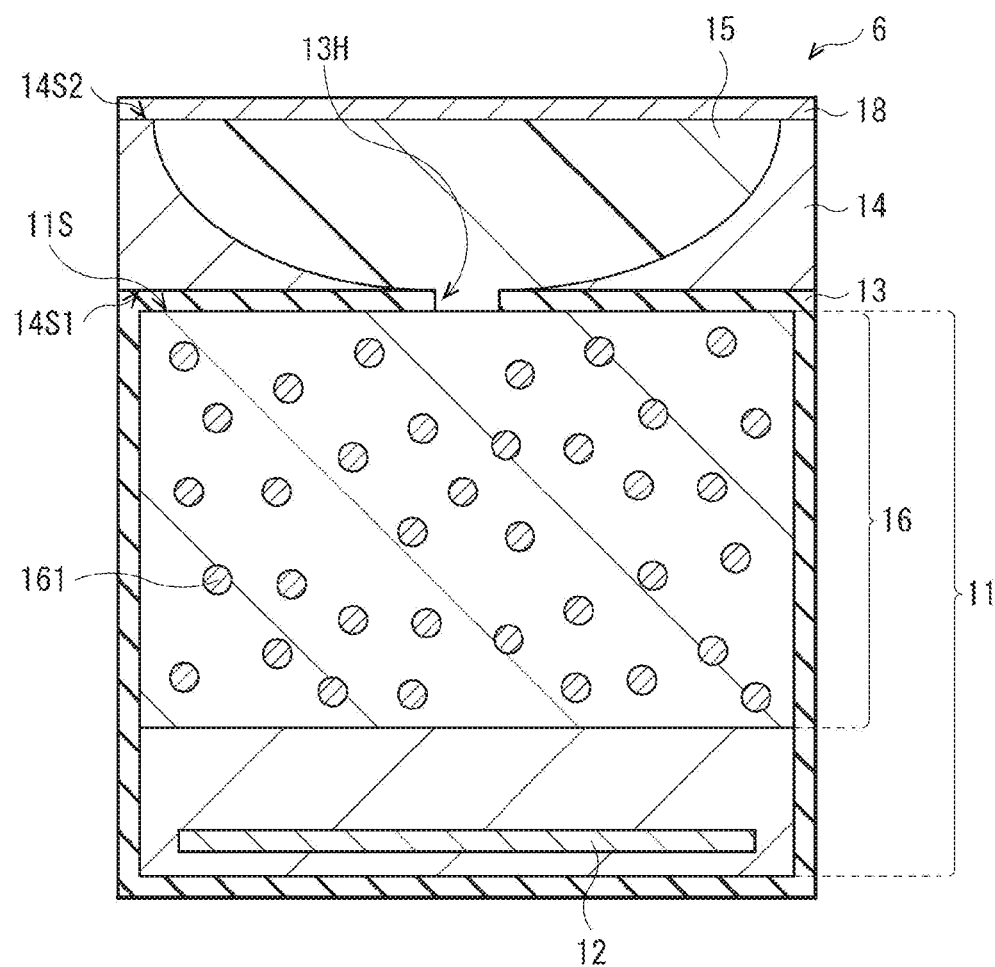
[FIG. 15]

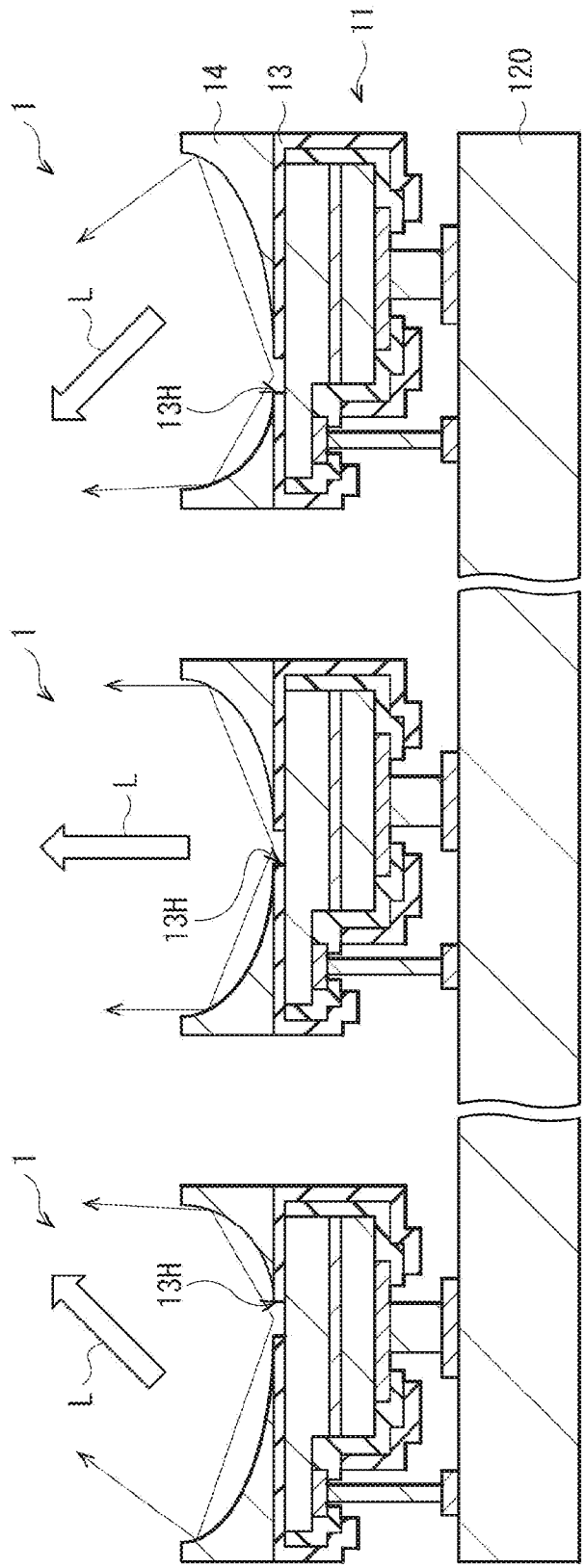
[FIG. 16]

[ FIG. 17 ]
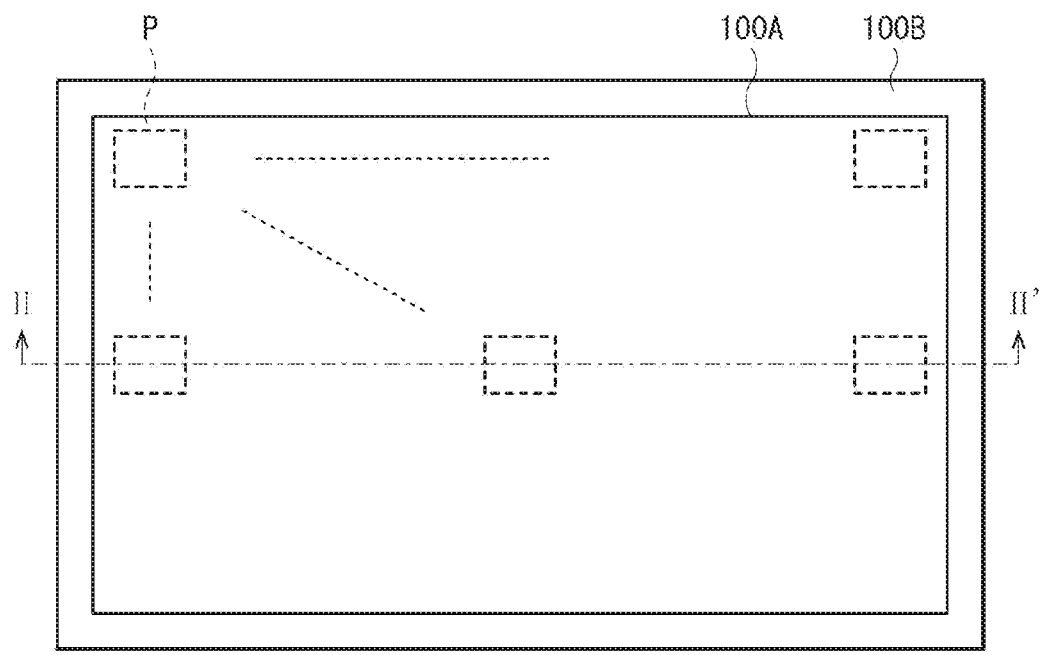
[ FIG. 18 ]
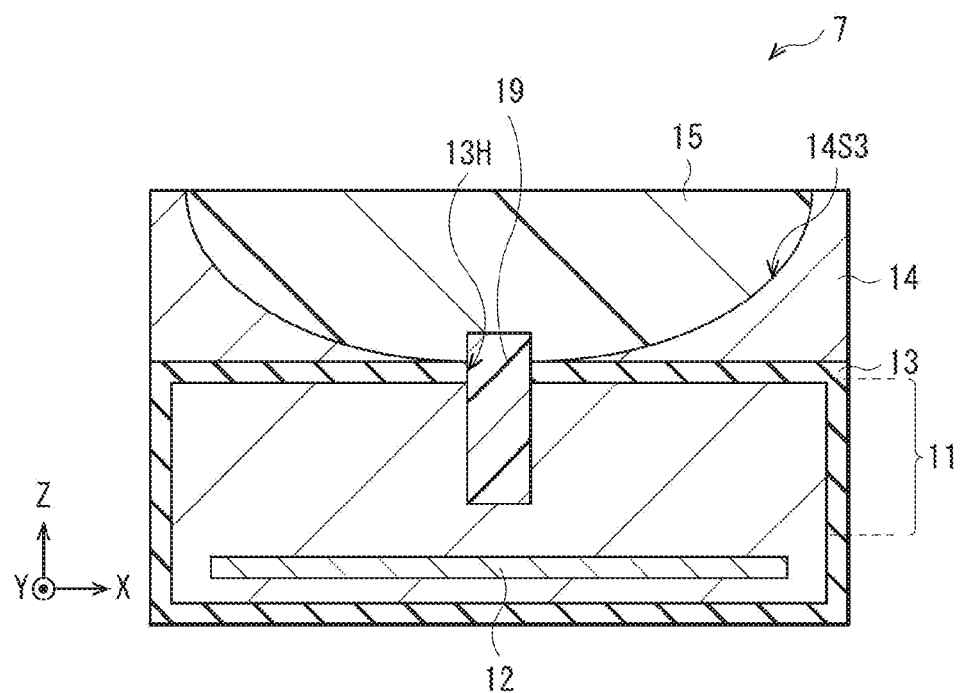

[ FIG. 19 ]
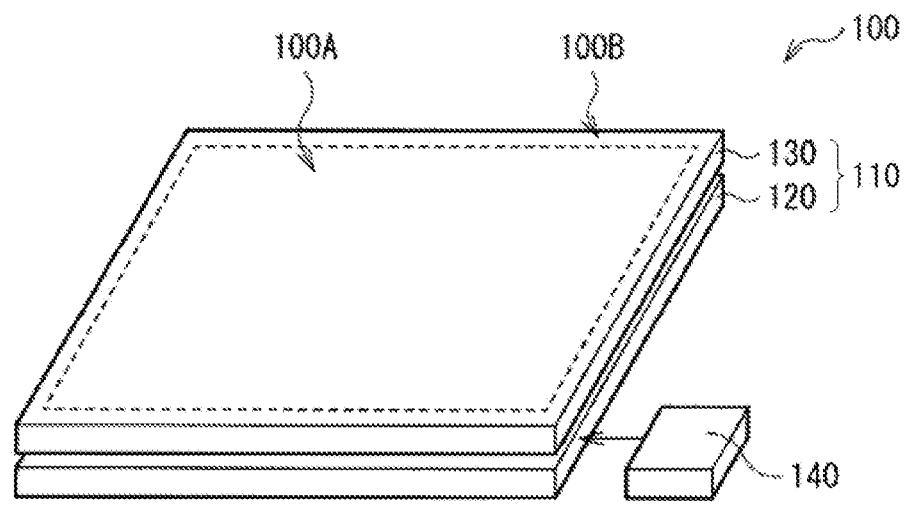
[ FIG. 20 ]
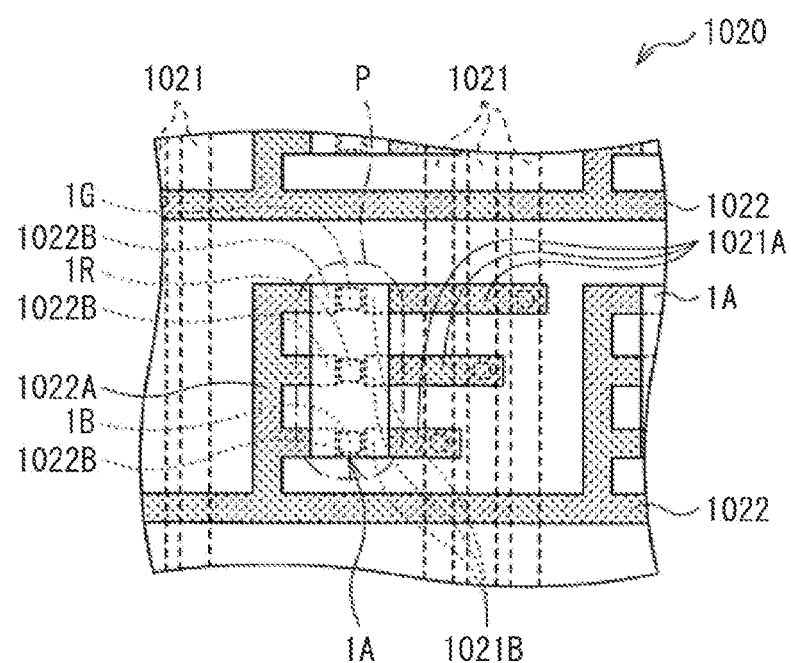

[FIG. 21]
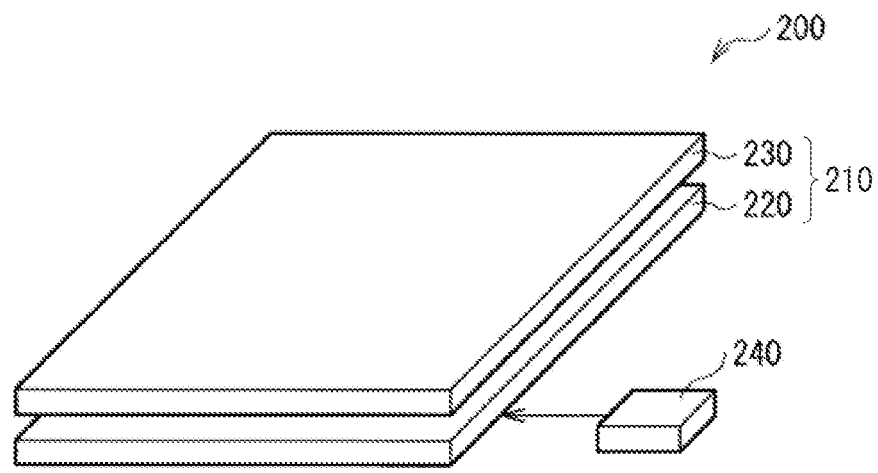
[FIG. 22]
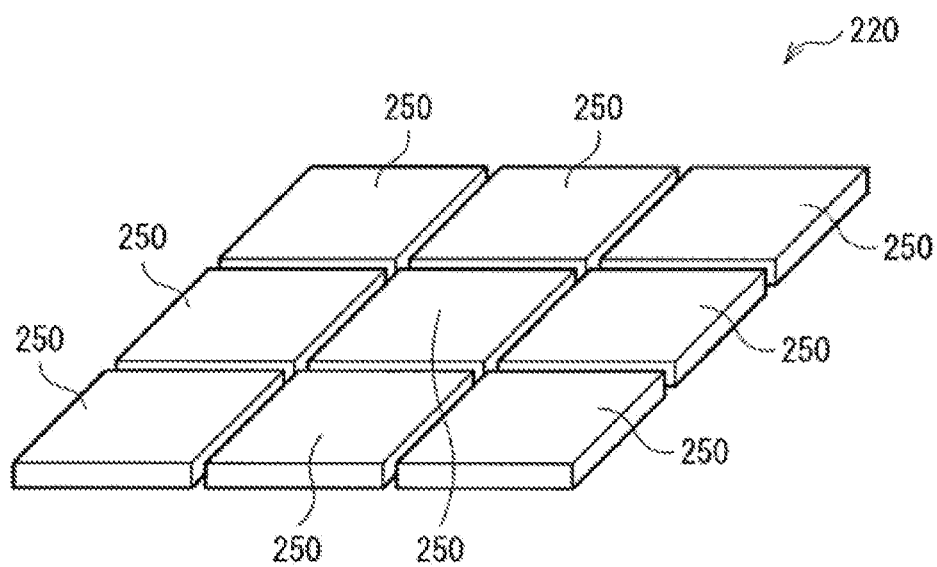

[ FIG. 23 ]
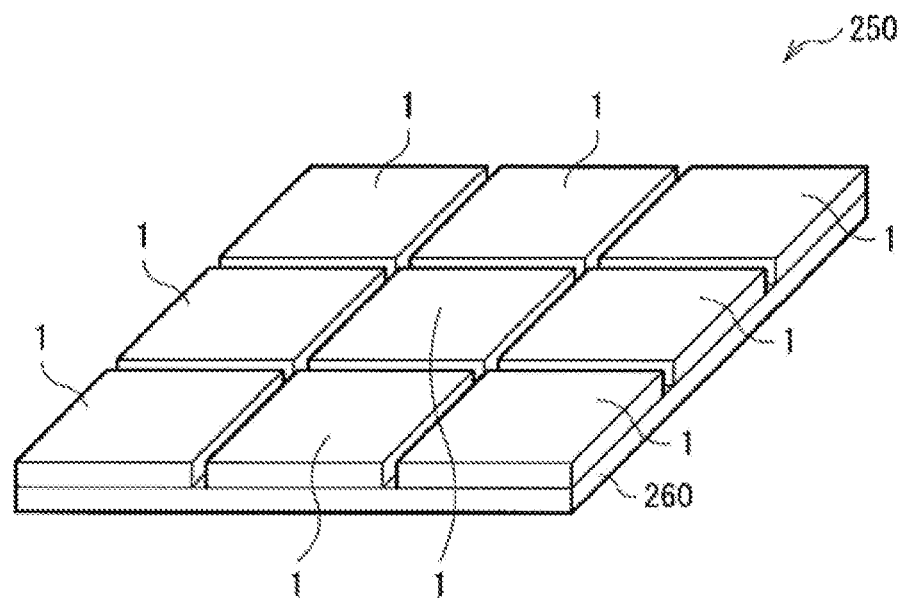
[ FIG. 24 ]
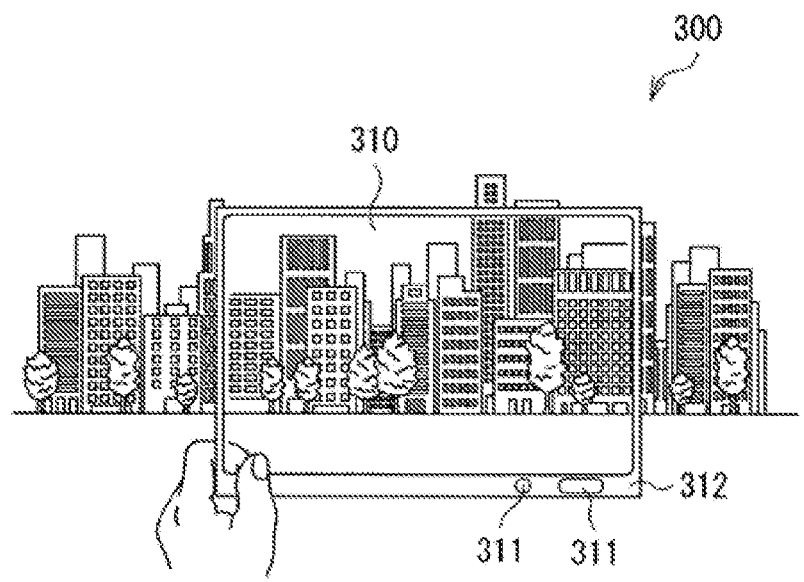

LIGHT-EMITTING DEVICE AND IMAGE DISPLAY APPARATUS

CROSS REFERENCE TO RELATED APPLICATIONS

This application is a U.S. National Phase of International Patent Application No. PCT/JP2022/011848 filed on Mar. 16, 2022, which claims priority benefit of Japanese Patent Application No. JP 2021-125301 filed in the Japan Patent Office on Jul. 30, 2021. Each of the above-referenced applications is hereby incorporated herein by reference in its entirety.

TECHNICAL FIELD

The present disclosure relates to a light-emitting device having a surface light source and an image display apparatus provided with this.

BACKGROUND ART

For example, Patent Literature 1 discloses an image display element in which a microlens is disposed on a light-emitting surface of a micro light-emitting element around which a dividing wall is provided, the image display element having a reflecting surface that is an inclined side surface of the dividing wall facing the microlens.

CITATION LIST

Patent Literature

PTL 1: Japanese Unexamined Patent Application Publication No. 2021-12251

SUMMARY OF THE INVENTION

Incidentally, improvement in light utilization efficiency is requested in a microdisplay to be used as a panel light source of an augmented reality (AR) headset or a small projector.

It is desirable to provide a light-emitting device and an image display apparatus that make it possible to improve the light utilization efficiency.

A light-emitting device of one embodiment of the present disclosure includes: a light source section including a surface light source; a light reflective film that covers a surface of the light source section and has one or more openings on a light outputting surface of the light source section; and a reflecting structure that is provided on side of the light outputting surface of the light source section and has one or more light reflecting surfaces around the one or more openings, the one or more light reflecting surfaces reflecting light outputted from the one or more openings in a predetermined direction.

An image display apparatus of one embodiment of the present disclosure includes a plurality of the light-emitting devices of the one embodiment disposed in an array.

In the light-emitting device of the one embodiment of the present disclosure and the image display apparatus of the one embodiment, the surface of the light source section including the surface light source is covered with the light reflective film, and the one or more openings are provided on the light reflective film covering the light outputting surface of the light source section. Thereby, the surface light source becomes a point light source and the reflecting structure reflects light outputted from the one or more openings in the predetermined direction, the reflecting structure being provided on the side of light outputting surface of the light source section.

BRIEF DESCRIPTION OF DRAWING

FIGS. 1A and 1B are schematic diagrams describing a schematic configuration of a light-emitting device according to one embodiment of the present disclosure.

FIG. 2 is a schematic cross-sectional diagram representing an example of a specific configuration of the light-emitting device illustrated in FIGS. 1A and 1B.

FIG. 3 is a schematic cross-sectional diagram representing an example of a configuration of a light-emitting unit including a plurality of the light-emitting devices illustrated in FIG. 2.

FIG. 4 is a diagram describing light concentration of a light-emitting device using a point light source, as a comparative example.

FIG. 5 is a diagram describing light concentration of a light-emitting device using a surface light source, as a comparative example.

FIG. 6 is a diagram describing light concentration of a light-emitting device using a surface light source, as a comparative example.

FIG. 7 is a diagram describing light concentration by a refractive lens.

FIG. 8 is a diagram describing light concentration by a reflecting structure.

FIG. 9 is a schematic cross-sectional diagram representing an example of a schematic configuration of a light-emitting device according to Modification Example 1 of the present disclosure.

FIG. 10 is a schematic cross-sectional diagram representing an example of a schematic configuration of a light-emitting device according to Modification Example 2 of the present disclosure.

FIG. 11 is a schematic cross-sectional diagram representing an example of a schematic configuration of a light-emitting device according to Modification Example 3 of the present disclosure.

FIG. 12 is a schematic cross-sectional diagram representing an example of a configuration of a light-emitting unit including a plurality of the light-emitting devices illustrated in FIG. 11.

FIG. 13 is a schematic cross-sectional diagram representing an example of a schematic configuration of a light-emitting device according to Modification Example 4 of the present disclosure.

FIG. 14 is a schematic cross-sectional diagram representing an example of a schematic configuration of a light-emitting device according to Modification Example 5 of the present disclosure.

FIG. 15 is a schematic cross-sectional diagram representing another example of the schematic configuration of the light-emitting device according to Modification Example 5 of the present disclosure.

FIG. 16 is a schematic cross-sectional diagram describing an example of a configuration of a light-emitting device at each position in a display region as Modification Example 6 of the present disclosure.

FIG. 17 is a schematic planar diagram representing a position of each light-emitting device illustrated in FIG. 16.

FIG. 18 is a schematic cross-sectional diagram representing g an example of a schematic configuration of a light-emitting device according to Modification Example 7 of the present disclosure.

FIG. 19 is a perspective view of an example of a configuration of an image display apparatus according to Application Example 1 of the present disclosure.

FIG. 20 is a schematic diagram representing an example of a layout of the image display apparatus illustrated in FIG. 19.

FIG. 21 is a perspective view of an example of a configuration of an image display apparatus according to Application Example 2 of the present disclosure.

FIG. 22 is a perspective view of a configuration of a mounting substrate illustrated in FIG. 21.

FIG. 23 is a perspective view of a configuration of a unit substrate illustrated in FIG. 22.

FIG. 24 is a diagram illustrating an image display apparatus according to Application Example 3 of the present disclosure.

MODES FOR CARRYING OUT THE INVENTION

In the following, some embodiments of the present disclosure will be described in detail with reference to the drawings. It is to be noted that the embodiments described below are specific examples of the present disclosure, and the present disclosure is not limited to the following embodiments. In addition, the arrangement, dimensions, dimension ratios, or the like of components in the present disclosure are not limited to the embodiment illustrated in each drawing. It is to be noted that the description will be given in the following order.

1. Embodiment (Example of a light-emitting device in which a surface of a light source section including a surface light source is covered with a light reflective film having openings on a light outputting surface of the light source section, a reflecting structure being stacked on the light reflective film)
2. Modification Example 1 (Example of a light-emitting device that combines a reflecting structure and a refractive lens)
3. Modification Example 2 (Example of a light-emitting device in which a plurality of openings is provided on a light reflective film covering a light outputting surface of one light source section and a plurality of light reflecting surfaces corresponding to the plurality of openings is stacked)
4. Modification Example 3 (Example of a light-emitting device having a wavelength conversion layer between a surface light source and a light reflecting section)
5. Modification Example 4 (Example of a light-emitting device having a light scattering layer between a surface light source and a light reflecting section)
6. Modification Example (Example of a light-emitting device having a wavelength selection reflective film above the wavelength conversion layer)
7. Modification Example 6 (Example of a light-emitting device in which a position of an opening varies in accordance of a position of a display region)
8. Modification Example 7 (Example of a light-emitting device in which a rod integrator is inserted in an opening)
9. Application Example 1 (Example of an image display apparatus)
10. Application Example 2 (Example of an image display apparatus)
11. Application Example 3 (Example of an image display apparatus)

1. Embodiment

FIGS. 1A and 1B illustrate a cross-sectional diagram FIG. 1A and a planar diagram FIG. 1B for describing a schematic configuration of a light-emitting device (light-emitting device 1) according to one embodiment of the present disclosure. It is to be noted that FIG. 1A corresponds to I-I' line illustrated in FIG. 1B. FIG. 2 represents one example of a specific cross-sectional configuration of the light-emitting device 1 illustrated in FIGS. 1A and 1B. The light-emitting device 1 is preferably used in a display pixel P of an image display apparatus (for example, an image display apparatus 100, see FIG. 19).

The light-emitting device 1 of the present embodiment includes a light source section 11 including a surface light source 12; a light reflective film 13 covering a surface of the light source section 11; and a reflecting structure 14 provided on side of a light outputting surface 11S of the light source section 11. The light reflective film 13 has an opening 13H for extracting light L outputted from the surface light source 12, on the light outputting surface 11S of the light source section 11. The reflecting structure 14 has a surface (surface 14S1) facing the light source section 11 and having an opening in alignment with the opening 13H. Around the opening, the reflecting structure 14 has a light reflecting surface 14S3 that reflects the light L outputted from the light source section 11 in a predetermined direction.

[Configuration of Light-Emitting Device]

A description of a configuration of the light-emitting device 1 is given below with reference to FIG. 2.

As described above, the light source section 11 includes the surface light source 12 as a light source. The surface light source 12 is a solid light-emitting device that emits the light L of a predetermined wavelength band from a light extracting surface. The surface light source 12 is an LED (Light Emitting Diode) chip, for example. An LED chip refers to a chip in a state in which the chip is cut out from a wafer used for crystal growth, and does not refer to a chip of a package type which is covered with molded resin, or the like. The LED chip has a size, for example, ranging from 1 μm to 100 μm, and is a so-called micro LED chip.

In the surface light source 12, a first conductivity type layer 121, an active layer 122, and a second conductivity type layer 123 are stacked in this order. An upper surface of the second conductivity type layer 123 is the light extracting surface and corresponds to the light outputting surface 11S of the light source section 11, for example. The light source section 12 has a columnar mesa part M that includes the first conductivity type layer 121 and the active layer 122. On side of a surface facing the light extracting surface, the light source section 12 has a step made by a convex portion where the first conductivity type layer 121 is exposed and a concave portion where the second conductivity type layer 123 is exposed. In the present embodiment, a surface that includes these convex portion and concave portion and face the light extracting surface is a lower surface. The surface light source 12 further has a first electrode 124 electrically coupled to the first conductivity type layer 121 and a second electrode 125 electrically coupled to the second conductivity type layer 123. The first electrode 124 and the second electrode are each provided on side of the lower surface. Specifically, the first electrode 124 is provided on the first conductivity type layer that is the convex portion of the lower surface, and the second electrode 125 is provided on the second conductivity type layer that is the concave portion of the lower surface.

The first conductivity type layer 121, the active layer 122, and the second conductivity layer 123 of the surface light source 12 each has a side surface covered with an insulating film 126. The insulating film 126 extends to, for example, a periphery of the first electrode 124 and the second electrode 125. The first electrode 124 and the second electrode 1125 are exposed to outside through an opening 126H1 and an opening 126H2, respectively, the opening 126H1 being provided on the first electrode 124 and the opening 126H2 being provided on the second electrode 125.

Materials that configure the first conductivity type layer 121, the active layer 122, and the second conductivity layer 123 are appropriately selected according to light of a desired wavelength band. For example, in a case where a III-V compound semiconductor material is used, the surface light source 12 emits ultraviolet light with an emission wavelength ranging from 360 nm to 430 nm, for example, or blue band light with an emission wavelength ranging from 430 nm to 500 nm, for example. It is possible to form the active layer 122 using a GaInN-based material, for example.

The first electrode 124 is in contact with the first conductivity type layer 121 and is electrically coupled to the first conductivity type layer 121. That is, the first electrode 124 is in ohmic contact with the first conductivity type layer 121. The first electrode 124 is a metal electrode, for example, and is configured as a multilayer film (Ni/Au) of nickel (Ni) and gold (Au), for example. In addition to this, the first electrode 124 may be formed using a transparent conductive material such as indium tin oxide (ITO), for example.

The second electrode 125 is in contact with the second conductivity type layer 123 and is electrically coupled to the second conductivity type layer 123. That is, the second electrode 125 is in ohmic contact with the second conductivity type layer 123. The second electrode 125 is a metal electrode, for example, and is configured as a multilayer film (Ti/Al) of titanium (Ti) and aluminum (Al) or a multilayer film (Cr/Au) of chromium (Cr) and gold (Au), for example. In addition to this, the second electrode 125 may be formed using the transparent conductive material such as ITO, for example.

The insulating film 126 is for electrically insulating the light reflective film 13 from the first conductivity type layer 121, the active layer 122, and the second conductivity layer 123. The insulating film 126 is preferably formed using a material transparent to light to be emitted from the active layer 122. Examples of such a material include $SiO_2$, $Si_2N_3$, $Al_2O_3$, $TiO_2$, and TiN. The insulating film 126 has a thickness of approximately 50 nm to 1 μm, for example. It is possible to form the insulating film 126 by thin film forming processes, such as CVD, vapor deposition, and sputtering, for example.

The light reflective film 13 is for reflecting light emitted from the active layer 122 and provided to cover a surface of the surface light source 12. Specifically, the light reflective film 13 extends from the light extracting surface of the surface light source 12 to a side face and a lower surface of the surface light source 12, via the insulating film 126. The light reflective film 13 is formed up to a part that is slightly recessed from an end of the insulating film 126, for example, in the opening 126H1 and the opening 126H2 of the insulating film 126.

As described above, the light reflective film 13 has the opening 13H on the light outputting surface 11S of the light source section 11. The opening 13H is for extracting light emitted from the active layer 122 to the outside. The opening 13H has an area that is smaller than an area of the surface light source 12 and is, for example, 50% or less of an area of the surface light source 12. This makes it possible to regard the surface light source 12 as a point light source. Furthermore, the light L emitted from the active layer 122 is reflected by the light reflective film 13, which makes it possible to extract, from the opening 13H, light other than light that is directly extractable from the opening 13H.

It is preferable to form the light reflective film 13 using a material with high reflectance with respect to the light emitted from the active layer 122, irrespective of an angle of incidence. Examples of such a material include gold (Au), silver (Ag), aluminum (Al), and platinum (Pt). In addition to this, for example, titanium (Ti), copper (Cu) or nickel (Ni) or an alloy of Ti, Cu, and Ni, etc. may be used. The light reflective film 13 has a thickness of approximately 10 nm to 500 nm, for example. It is possible to form the light reflective film 13 by the thin film forming processes, such as CVD, vapor deposition, and sputtering, for example.

The reflecting structure 14 outputs the light L outputted from the opening 13H of the light reflective film 13 in a predetermined direction (Z-axis direction, for example). The reflecting structure 14 has a pair of mutually facing surfaces (surface 14S1 and surface 14S2) and a light reflecting surface 14S3 that reflects the light L outputted from the opening 13H of the light reflective film 13 in the predetermined direction. The reflecting structure 14 is disposed with the light reflective film 13 interposed so that the surface 141S faces the light outputting surface 12S of the surface light source 12. The reflecting structure 14 has a concave portion 14H extending from the surface 14S2 to the surface 14S1. A side surface of the concave portion 14H is shaped like a paraboloid of revolution, for example. A bottom face of the concave portion 14H is open in alignment with the opening 13H of the reflective film 13, for example.

The reflecting structure 14 is formed using a material that reflects the light emitted from the active layer 122. Examples of such a material include titanium (Ti), aluminum (Al), copper (Cu), gold (Au), nickel (Ni), or an alloy of Ti, Al, Cu, Au, and Ni. In addition to this, the reflecting structure 14 may be formed using, for example, a distribution Bragg reflector (DBR) with wavelength selectivity. Formation of the reflecting structure 14 using the DBR makes it possible to selectively reflect light of main emission, without reflecting an unintended wavelength such as stray light emitted in other colors or excitation light (light outputted from the surface light source 12) in a case where a wavelength conversion layer 16, to be described below, is used.

It is to be noted that the reflecting structure 14 may be formed using a material other than the above-described material with light reflectivity. In that case, on the side surface of the concave portion 14H is formed a reflective film, such as the reflective film 13, including the material with high reflectance with respect to the light L outputted from the opening 13H irrespective of the incident angle.

It is to be noted that although FIG. 1B illustrates an example of the light source section 11, the reflecting structure 14, and the opening 13H each having a rectangular (substantially square) planar shape, the planar shapes of the light source section 11, the reflecting structure 14, and the opening 13H are not limited to this. The planar shapes of the light source section 11, the reflecting structure 14, and the opening 13H may each be, for example, a rectangular shape or a polygonal shape other than a square. Alternatively, the planar shapes of the light source section 11, the reflecting structure 14, and the opening 13H may each be a circular shape including an ellipse. In addition, although FIGS. 1A and 2 illustrate an example in which the side surface of the opening 13H is substantially vertical to the light outputting surface 11S, the side surface of the opening 13H is not limited to this. The side surface of the opening 13H may be, for example, an inclined surface that widens from the side of the light source section 11 toward the reflecting structure 14.

[Configuration of Light-Emitting Unit]

In an image display apparatus 100 to be described below, a plurality of the light-emitting devices 1 is arranged in a two-dimensional array in a display region 100A. FIG. 3 schematically represents, for example, a cross-sectional configuration of a light-emitting unit TA disposed for each of the display pixels P of the image display apparatus 100.

The light-emitting unit TA is, for example, the plurality of light-emitting devices 1 arrayed in a line. The light-emitting unit TA has, for example, an elongate shape extending in a direction in which the plurality of light-emitting devices 1 is disposed.

In the light-emitting unit TA, each of the light-emitting devices 1 emits light having a mutually different wavelength band, for example. The display pixel P of the image display apparatus 100 includes, for example, three color pixels Pr, Pg, and Pb corresponding to RGB. As illustrated in FIG. 3, for example, the light-emitting unit TA includes light-emitting devices 1R, 1G, and TB that emit light corresponding to each of the color pixels Pr, Pg, and Pb. That is, the light-emitting device 1R that emits red band light (red light Lr) is disposed in the color pixel Pr. The light-emitting device 1G that emits green band light (green light Lg) is disposed in the color pixel Pg. The light-emitting device 1B that emits the blue band light (blue light Lb) is disposed in the color pixel Pb. For example, in a case where the light-emitting unit TA has an elongate shape extending in a direction of the arrayed light-emitting devices 1, the light-emitting device 1R is disposed, for example, near a short side of the light-emitting unit 1A, and the light-emitting device 1B is disposed, for example, near a short side different from the short side to which the light-emitting device 1B is proximate, among short sides of the light-emitting unit TA. The light-emitting device 1G is disposed, for example, between the light-emitting device 1R and the light-emitting device 1B. It is to be noted that a position of each of the light-emitting devices 1R, 1G, and 1B is not limited to the above.

The light-emitting devices 1R, 1G, and TB are each mounted on a driving substrate 21 via, for example, pad electrodes 22 and 23 as well as bumps 24 and 25. It is to be noted that other bonding methods such as Cu—Cu bonding, or the like may be used for mounting onto the driving substrate 21.

It is to be noted that although FIG. 3 illustrates the light-emitting unit TA that emits light corresponding to RGB, a configuration of the light-emitting unit TA is not limited to this. For example, the light-emitting unit TA may be configured to include a plurality of light-emitting devices that emit light in mutually same wavelength bands, or may be configured as a light-emitting unit, for example, that emits light of two colors, such as RG or RB. Alternatively, the light-emitting device TA may be configured as a light-emitting device that emits light of 4 or more colors such as RGBW. Furthermore, although FIG. 3 illustrates the light-emitting unit TA having the display pixels P including the color pixels Pr, Pg, and Pb as one unit, the configuration of the light-emitting unit 1A is not limited to this. The light-emitting unit TA may have a configuration, for example, that has the entire display region 100A of the image display apparatus 100 as one unit. In that case, like the driving substrate 21, the respective light-emitting devices 1R, 1G, and 1B corresponding to the display pixels Pr, Pg, and Pb are regularly arranged in a mosaic pattern.

[Workings and Effects]

In the light-emitting device 1 of the present embodiment, the surface of the light source section 11 including the surface light source 12 is covered with the light reflective film that has the opening 13H for extracting light, on the light outputting surface 11S1 of the light source section 11. Furthermore, the reflecting structure 14 having the light reflecting surface 14S3 is disposed on the side of the light outputting surface 11S of the light source 11, the light reflecting surface 14S3 reflecting the light L extracted from the opening 13H in the predetermined direction. This will be described below.

In recent years, there has been a demand for development of compact and highly efficient microdisplays as panel light sources for augmented reality (AR) headsets or small projectors. Generally, in a case where a microdisplay is used for projection applications, an optical lens is combined for delivering images. In AR headsets and small projectors, downsizing of the optical lens itself is also demanded, and a capturing angle of the optical lens is approximately 10° semi-angle. Therefore, microdisplays with high front orientation that allow for light concentration in approximately 10° semi-angle are demanded in a case where an attempt is made to improve light concentration efficiency of optics as a whole.

Techniques to improve the front orientation of the panel light source include provision of a light concentrating structure such as a lens or a mirror as described above. In a case where these light concentrating structures are used, like a light-emitting device 1000 as illustrated in FIG. 4, the light concentrating structure (reflecting structure 1400) is designed to be sufficiently away from a light source 1200 in order to geometrically limit a direction of light beams entering the light concentrating structure. This makes it possible to regard the light source 1200 as a point light source.

However, in a case where, due to restrictions such as a pixel pitch, or the like as in a microdisplay, it is not possible to dispose the light concentrating structure at such a distance that allows for the light source to be regarded as the point light source, as in light-emitting devices 1000B and 1000C illustrated in FIG. 5 and FIG. 6, the light source 2000 becomes a surface light source, causing light loss, no matter how the reflecting structure 1400 is designed. Consequently, microdisplays have been disadvantageous in that it is not possible to achieve adequate light concentrating effect.

In contrast, in the present embodiment, the surface of the light source section 11 including the surface light source 12 is covered with the light reflective film 13 having the opening 13H for extracting light on the light outputting surface 11S1 of the light source section 11, so that the surface light source 12 becomes the point light source. As a result, of light outputted from the surface light source 12, even light that is not directly directed to the opening 13H is repeatedly reflected by the light reflective film 13 and thereby finally becomes light that is directed to the opening 13H and is extracted from the opening 13H.

Furthermore, by disposing the reflecting structure 14 having the light reflecting surface 14S3 on the side of the light outputting surface 11S of the light source section 11, the light L outputted from the opening 13H is reflected efficiently in the predetermined direction (Z-axis direction, for example).

For example, a refractive lens (refractive lens 1500) that is disposed on the light-emitting surface of the above-described micro light-emitting device has effect of causing concentration of mainly the light L in a front direction (light to be outputted at an angle of 0° to 40° in a case where the front direction of a light-emitting point X is 0°, for example), as illustrated in FIG. 7, for example. In contrast, as illustrated in FIG. 8, for example, a mirror (reflecting structure 1400, for example) has the effect of causing concentration of mainly the light L in a side direction (light to be outputted at an angle of 50° to 90° in a case where the front direction of the light-emitting point X is 0°, for example) to the front direction. Therefore, in a light source having isotropic distribution of light, for example, a mirror obtains the higher light concentrating effect than a refractive lens.

As described above, the light-emitting device 1 of the present embodiment is able to improve the light utilization efficiency. The present technique becomes particularly useful in microdisplays with the pixel pitch restrictions.

Next, a description of Modification Examples 1 to 7 of the present disclosure will be given. It is to be noted that components corresponding to the components of the light-emitting device 1 of the above-described embodiment are assigned with the same reference numerals and a description is omitted.

2. Modification 1

FIG. 9 schematically represents an example of a cross-sectional configuration of a light-emitting device 2 according to Modification Example 1 of the present disclosure. Similarly to the light-emitting device 1 in the above-described embodiment, for example, the light-emitting device 2 is preferably used for the display pixels P of the image display apparatus 100.

In the light-emitting device 2, the concave portion 14H of the reflecting structure 14 is filled with, for example, a resin layer 15 having optical transparency. For example, a refractive lens 15L is formed on a surface of the resin layer 15, as illustrated in FIG. 9. As a result, it is possible to cause the concentration of not only the light L in the side direction (light to be outputted at an angle of 50° to 90° in a case where the front direction of the light-emitting point X is 0°, for example) but also the light L in the front direction (light to be outputted at an angle of 0° to 40° in a case where the front direction of a light-emitting point X is 0°, for example).

In this manner, because in the light-emitting device 2 of this modification example, the reflecting structure 14 is used in combination with the refractive lens 15L, it is possible to improve the light concentration efficiency more than the above-described embodiment, depending on light distribution characteristics.

3. Modification Example 2

FIG. 10 schematically represents an example of a cross-sectional configuration of a light-emitting device 3 according to Modification Example 2 of the present disclosure. Similarly to the light-emitting device 1 in the above-described embodiment, for example, the light-emitting device 3 is preferably used for the display pixels P of the image display apparatus 100.

Although the above-described embodiment illustrates an example in which the one opening 13H and the one light reflecting surface 14S3 are provided for the one light source section 11, a plurality of the opening 13H and a plurality of the light reflecting surfaces 14S3 may be provided for the one light source section 11, as illustrated in FIG. 10, for example.

In this manner, in the light-emitting device 3 of this modification example, the plurality of the openings 13H and the plurality of the light reflecting surfaces 14S3 are provided for the light source section 11. This makes it possible to reduce a height of the reflecting structure 14. Moreover, it is possible to further improve the light utilization efficiency because of quantum effect or interference effect of light.

4. Modification Example 3

FIG. 11 schematically represents an example of a cross-sectional configuration of a light-emitting device 4 according to Modification Example 3 of the present disclosure. Similarly to the light-emitting device 1 in the above-described embodiment, for example, the light-emitting device 4 is preferably used for the display pixels P of the image display apparatus 100. FIG. 12 schematically represents, for example, a cross-sectional configuration of a light-emitting device 4A disposed for each of the display pixels P of the image display apparatus 100.

The light source 11 may further have the wavelength conversion layer 16. The wavelength conversion layer 16 is located on side of the light extracting surface of the surface power source 12. That is, the wavelength conversion layer 16 is disposed between the surface power source 12 and the reflecting structure 14. In this modification example, the wavelength conversion layer 16 corresponds to a specific example of the "surface power source" of the present disclosure. In the light source section 11 of this modification example, an upper surface of the wavelength conversion layer 16 is the light outputting surface 11S and the light reflective film 13 is provided from the upper surface of the wavelength conversion layer 16 to the lower surface of the surface light source 12.

The wavelength conversion layer 16 converts the light outputted from the surface light source 12 into light of a desired wavelength band (red light Lr, green light Lg, or blue light Lb, for example). It is possible to form the wavelength conversion layer 16 using, for example, quantum dots 161 corresponding to RGB. Specifically, for obtaining the red light Lr, it is possible to select a quantum dot 161R from InP, GaInP, InAsP, CdSe, CdZnSe, CsTeSe, or CdTe, etc., for example. For obtaining the green light Lg, it is possible to obtain a quantum dot 161G from InP, GaInP, ZnSeTe, ZnTe, CdSe, CdZnSe, CdS, or CdSeS, etc., for example. For obtaining the blue light Lb, it is possible to select from ZnSe, ZnTe, ZnSeTe, CdSe, CdZnSe, CdS, CdZnS, and CdSeS, etc. It is to be noted that in a case where the blue light is outputted from the surface light source 12, a resin layer having optical transparency may be formed as a blue wavelength conversion layer 16B, as illustrated in FIG. 12.

In this manner, in the light-emitting device 4 of this modification example, the wavelength conversion layer 16 is provided between the surface light source 12 and the reflecting structure 14. This makes it possible to use, for example, an excitation light source with high luminous efficiency as the surface light source 12. Therefore, it is possible to provide a high-intensity image display apparatus.

Modification Example 4

FIG. 13 schematically represents an example of a cross-sectional configuration of a light-emitting device 5 according to Modification Example 4 of the present disclosure. Similarly to the light-emitting device 1 in the above-described embodiment, for example, the light-emitting device 5 is preferably used for the display pixels P of the image display apparatus 100.

The light source section 11 may further have a light scattering layer 17. The light scattering layer 17 is disposed on the side of the light extracting surface of the surface light source 12. That is, the light scattering layer 17 is disposed between the surface light source 12 and the reflecting structure 14. In the light source section 11 of this modification example, an upper surface of the light scattering layer 17 is the light outputting surface 11S and the light reflective film 13 is provided from the upper surface of the light scattering layer 17 to the lower surface of the surface light source 12.

The light scattering layer 17 scatters the light L outputted from the surface light source 12 to thereby reduce biased light distribution. It is possible to form the light scattering layer 17, for example, by dispersing scattering particles 171 in resin. The scattering particles 171 are dielectric substances having a particle size ranging from 100 nm to 1000 nm, for example. Examples of specific materials of the scattering particles 171 include silicon oxide ($SiO_2$), titanium oxide ($TiO_2$), aluminum oxide ($Al_2O_3$), aluminum nitride (AlN), boron nitride (BN), and zinc oxide (ZnO), or the like. It is to be noted that the scattering particles 171 may be air bubbles mixed in the resin.

In this manner, in the light-emitting device 5 of this modification example, the light scattering layer 17 is provided between the surface light source 12 and the reflecting structure 14. It is possible to increase a percentage of the light L in the side direction (light to be outputted at an angle of 50° to 90° in a case where the front direction of the light-emitting point X is 0°, for example) reflected by the light reflective surface 14S3 of the reflecting structure 14, of the light L outputted from the opening 13H. Therefore, it is possible to improve the light concentration efficiency to the front direction (Z-axis direction) by the reflecting structure 14 and further improve the light utilization efficiency.

6. Modification Example 5

FIG. 14 schematically represents an example of a cross-sectional configuration of a light-emitting device 6 according to Modification Example 4 of the present disclosure. FIG. 15 schematically represents another example of the cross-sectional configuration of the light-emitting device 6 according to Modification Example 4 of the present disclosure.

In a case where the wavelength conversion layer 16 is used as in Modification Example 3, it is preferable to provide a wavelength selection reflective film 18 that selectively reflects the light outputted from the surface light source 12, for example. The wavelength selection reflective film 18 is provided, for example, on the upper surface of the wavelength conversion layer 16 (FIG. 14) or on the side of the surface 14S2 of the reflecting structure 14 (FIG. 15). This makes it possible to improve color purity of light L to be outputted from the light-emitting device 5.

It is to be noted that the wavelength selection reflective film 18 has an incident angle characteristic and generally has the highest wavelength selectivity with respect to light incident from a direction of 0°. As a result, as illustrated in FIG. 15, provision of the wavelength selection reflective film 18 on the side of the surface 14S2 of the reflecting structure 14 allows for efficient reflection of the light that has not been wavelength-converted in the wavelength conversion layer 16.

7. Modification Example 6

FIG. 16 schematically represents an example of a cross-sectional configuration of the light-emitting devices 1 as Modification Example 6 of the present disclosure. FIG. 17 represents a position in the display region 100A of each of the light-emitting devices 1, illustrated in FIG. 16. It is to be noted that FIG. 16 corresponds to line II-II' illustrated in FIG. 17, for example.

Although the above-described embodiment and Modification Examples 1 to 5 illustrate an example in which the opening 13H is provided substantially at a middle of the light outputting surface 11S of the light source section 11, the position of the opening 13H is not limited to this. For example, in a case where a plurality of the light-emitting devices 1 is arranged in a two-dimensional array in the display region 100A of the image display apparatus 100, the position of the opening 13H may be adjusted according to the position in the display region 100A. In addition, a structure of the reflecting structure 14 may also be changed according to the position in the display region 100A.

Specifically, as illustrated in FIG. 16, for example, the light-emitting device 1 disposed closer to the periphery of the display region 100A is shifted toward a central part of the display region 100A. The reflecting structure 14 is such configured that the light-emitting device 1 disposed closer to the periphery of the display region 100A has the light reflecting surface 14S3 angled to a middle direction. Because the light L outputted from the opening 13H is outputted from a geometrically limited region, the angle of incidence on the light reflecting surface 14S3 is determined. Therefore, by designing an angle of the reflecting surface 14S3 in a desired direction of reflection, it is possible to cause light concentration in the desired direction. It is possible to adjust the direction of light concentration of the light L outputted from the opening 13D by adjusting either the position of the opening 13H or the angle of the light reflecting surface 14S3. However, by combining both, it is possible to efficiently adjust the direction of light concentration.

In this manner, by adjusting the position of the opening 13H in the light outputting surface 11S of the light source section 11 and the structure of the light reflecting surface 14S3 of the reflecting structure 14 to control the direction of light concentration, it is possible to apply the light-emitting device 1, or the like to panel light sources (binocular displays) for light field displays.

8. Modification Example 7

FIG. 18 schematically represents an example of a cross-sectional configuration of a light-emitting device 7 according to Modification Example 7 of the present disclosure. As illustrated in FIG. 18, for example, a rod integrator 19 may be inserted into the opening 13H, the rod integrator 19 penetrating from the surface light source 12 to the concave portion 14H of the reflecting structure 14. The rod integrator 19 has a columnar shape, or a conical or pyramidal shape having an apex on the side of the reflecting structure 14. This makes it possible to efficiently extract, from the opening 13H, the light emitted from the active layer 122 of the surface light source 12.

9. Application Example 1

FIG. 19 is a perspective view of an example of a schematic configuration of an image display apparatus (image display apparatus 100). In the image display apparatus 100, the light-emitting devices (light-emitting devices 1, for example) of the present disclosure are used for the display pixels P. As illustrated in FIG. 19, for example, the image display apparatus 100 includes a display panel 110 and a control circuit 140 that drives the display panel 110.

The display panel 110 is obtained by stacking a mounting substrate 120 and a transparent substrate 130 on each other. A surface of the transparent substrate 130 is an image display surface, and has the display region 100A in a middle part and a frame region 100B around the display region 100A, the frame region 100B being a non-display region.

FIG. 20 represents an example of wiring line layout of a region corresponding to the display region 100A, on a surface of the mounting substrate 120 on side of the transparent substrate 130. As illustrated in FIG. 20, for example, in the region corresponding to the display region 100A on the surface of the mounting substrate 120, a plurality of data wiring lines 1021 is formed extending in a predetermined direction, and arranged in parallel at a predetermined pitch. Furthermore, in the region corresponding to the display region 100A on the surface of the mounting substrate 120, for example, a plurality of scanning wiring lines 1022 is formed extending in a direction intersecting (for example, perpendicular to) the data wiring lines 1021, and arranged in parallel at a predetermined pitch. The data wiring lines 1021 and the scanning wiring lines 1022 include a conductive material such as Cu, for example.

The scanning wiring lines 1022 are formed, for example, on the outermost surface and are formed on, for example, an unillustrated insulating layer that is formed on a base material surface. It is noted that the base material of the mounting substrate 120 includes, for example, a silicon substrate or a resin substrate, or the like, and the insulating layer on the base material includes, for example, SiN, SiO, aluminum oxide (AlO) or a resin material. On the other hand, the data wiring lines 1021 are formed in a layer (layer below the outermost layer, for example) different from the outermost layer including the scanning wiring lines 1022, and are formed in the insulating layer on the base material, for example.

The display pixels P are formed in the vicinity of intersections of the data wiring line 1021 and the scanning wiring lines 1022. A plurality of the display pixels P is arranged, for example, in a matrix in the display region 100A. Each of the display pixels P has the color pixels Pr, Pg, and Pb corresponding to RGB, for example, and the corresponding light-emitting devices 1R, 1G, and 1B are respectively mounted in the color pixels Pr, Pg, and Pb. FIG. 20 illustrates a case where one display pixel P includes three light-emitting devices 1R, 1G, and 1B, and it is possible for the light-emitting device 1R to output red light, for the light-emitting device 1G to output green light, and for the light-emitting device 1B to output blue light, respectively.

The light-emitting device 1 is provided with, for example, a pair of terminal electrodes for each of the color pixels Pr, Pg, and Pb, or with terminal electrodes one of which is common to the color pixels Pr, Pg, and Pb and the other of which is disposed for each of the color pixels Pr, Pg, and Pb. Then, one of the terminal electrodes is electrically coupled to the data wiring line 1021 and the other terminal electrode is electrically coupled to the scanning wiring line 1022. For example, the one terminal electrode is electrically coupled to a pad electrode 1021B at a tip of a branch 1021A provided in the data wiring line 1021. In addition, for example, the other terminal electrode is electrically coupled to a pad electrode 1022B at a tip of a branch 1022A provided in the scanning wiring line 1022.

The pad electrodes 1021B and 1022B are formed, for example, on the outermost layer, and provided in a site where the light-emitting device 1 is mounted, as illustrated in FIG. 20, for example. Here, the pad electrodes 121B and 122B includes the conductive material such as Au (gold), or the like, for example.

The mounting substrate 120 is further provided with, for example, an unillustrated plurality of struts that regulate spacing between the mounting substrate 120 and the transparent substrate 130. The struts may be provided in a region facing the display region 100A or may be provided in a region facing the frame region 100B.

The transparent substrate 130 includes, for example, a glass substrate or a resin substrate, or the like. In the transparent substrate 130, a surface on the side of the light-emitting device 1 may be flat, but is preferably a rough surface. The rough surface may be provided over the entire region facing the display region 100A or may be provided only in the region facing the display pixels P. Light emitted from the color pixels Pr, Pg, and Pb enters the rough surface, and the rough surface has fine convexities and concavities. It is possible to make the convexities and concavities on the rough surface by means of sand blasting, dry etching, or the like.

The control circuit 140 drives each of the display pixels P (each light-emitting device 1) on the basis of an image signal. The control circuit 140 includes, for example, a data driver that drives the data wiring lines 1021 coupled to the display pixels P and a scan driver that drives the scanning wiring line 1022 coupled to the display pixels P. As illustrated in FIG. 19, for example, the control circuit 140 may be provided separately from the display panel 110 and coupled to the mounting substrate 120 via wiring, or may be mounted on the mounting substrate 120.

It is to be noted that the image display apparatus 100 illustrated in FIG. 19 is an example of a passive-matrix image display apparatus. The light-emitting device 1 of the present embodiment is not limited to the passive-matrix image display apparatus (image display apparatus 100). It is also possible to apply the light-emitting device 1 of the present embodiment to an active-matrix image display apparatus. It is to be noted that the frame region 100B illustrated in FIG. 19, for example, is not necessary in the active-matrix image display apparatus.

10. Application Example 2

FIG. 21 is a perspective view of another configuration example of an image display apparatus (image display apparatus 200) using the light-emitting device (light-emitting device 1, for example) of the present disclosure. The image display apparatus 200 is so-called a tiling display. As illustrated in FIG. 21, for example, the image display apparatus 200 includes a display panel 210 and a control circuit 240 that drives the display panel 210.

The display panel 210 is obtained by stacking a mounting substrate 220 and a facing substrate 230 on each other. A surface of the facing substrate 230 is an image display surface, and has a display region in a middle part and a frame region around the display region, the frame region being a non-display region (both of which are not illustrated). The facing substrate 230 is disposed at a position facing the mounting substrate 220 via a predetermined gap. It is to be noted that the facing substrate 230 may be in contact with an upper surface of the mounting substrate 220.

FIG. 22 schematically represents an example of a configuration of the mounting substrate 220. As illustrated in FIG. 22, for example, the mounting substrate 220 includes a plurality of unit substrates 250 that are laid out like tiles. It is to be noted that although FIG. 22 illustrates an example in which the mounting substrate 220 includes the 9 unit substrates 250, the number of the unit substrates 250 may be 10 or more or 8 or less.

FIG. 23 represents an example of a configuration of the unit substrate 250. The unit substrate 250 has, for example, the plurality of light-emitting devices 1 laid out like tiles and a support substrate 260 supporting the light-emitting devices 1. Each unit substrate 250 further has an unillustrated control substrate. The support substrate 260 includes, for example, a metal frame (metal plate) or a wiring substrate, or the like. In a case where the support substrate 260 includes a wiring substrate, the support substrate 260 is able to act as the control substrate. At this time, at least one of the support substrate 260 or the control substrate is electrically coupled to each of the light-emitting devices 1.

11. Application Example 3

FIG. 24 represents appearance of a transparent display 300. The transparent display 300 includes, for example, a display section 310, an operation section 311, and a housing 312. A light-emitting apparatus (light-emitting device 1, for example) of the present disclosure is used for the display section 310. In this transparent display 300, it is possible to display images or textual data while passing through background of the display section 310.

In the transparent display 300, a substrate having optical transparency is used for a mounting substrate. Each electrode provided in the light-emitting device 1 is formed using a conductive material having optical transparency, similarly to the mounting substrate. Alternatively, each electrode has a structure that is difficult to visibly recognize by supplementing a width of wiring lines or thinning of a thickness of the wiring lines. In addition, the transparent display 300 is enabled to display in black by superimposing a liquid crystal layer having a driving circuit, for example, and is able to switch between transmission and black display by controlling a light distribution direction of the liquid crystal.

As described above, a description has been given of the present disclosure with reference to the embodiment, Modification Examples 1 to 7, and Application Examples 1 to 3. However, the present disclosure is not limited to the above-described embodiment, and various modifications are possible. For example, in the above-described embodiment, or the like, although an example has been illustrated in which the LED chip having the mesa part M is used as the surface light source 12, a shape of the LED chip is not limited to this. In addition, although the above-described embodiment illustrates an example in which a LED chip using an inorganic semiconductor is used as the surface light source 12, the surface light source is not limited to this. As the surface light source 12, use of an LED (OLED) using, for example, an organic semiconductor or a semiconductor laser (Laser Diode: LD) is possible.

It is to be noted that the effects described herein are merely illustrative and non-limiting, and may further include other effects.

It is to be noted that the present disclosure may have the following configurations. According to the present technique with the following configurations, a surface light source becomes a point light source by covering a surface of a light source section including the surface light source with a light reflective film and providing one or more openings on the light reflective film covering a light outputting surface of the light source section, and a reflecting structure provided on side of the light outputting surface of the light source section reflects light outputted from the one or more openings in a predetermined direction. Therefore, it is possible to improve the utilization efficiency of light.

(1)

A light-emitting device including:
  a light source section including a surface light source;
  a light reflective film that covers a surface of the light source section and has one or more openings on a light outputting surface of the light source section; and
  a reflecting structure that is provided on side of the light outputting surface of the light source section and has one or more light reflecting surfaces around the one or more openings, the one or more light reflecting surfaces reflecting light outputted from the one or more openings in a predetermined direction.

(2)

The light-emitting device according to (1), in which the reflecting structure is disposed with the light reflective film interposed on the light outputting surface of the light source section.

(3)

The light-emitting device according to (1) or (2), in which an area of the opening is 50% or less of an area of the surface light source.

(4)

The light-emitting device according to any one of (1) to (3), in which
  the reflecting structure has a first surface facing the light outputting surface of the light source section and a second surface provided on an opposite side of the first surface, and
  the one or more light reflecting surfaces include side surfaces of concave portions extending from the second surface to the first surface, and bottom faces of the concave portions are open.

(5)

The light-emitting device according to (4), in which the one or more light reflecting surfaces have a shape of a paraboloid of revolution.

(6)

The light-emitting device according to (4) or (5), in which the concave portion is filled with a resin layer having optical transparency.

(7)

The light-emitting device according to (6), in which the resin layer has a lens shape on side of the second surface of the reflecting structure.

(8)

The light-emitting device according to any one of (1) to (7), in which the light source section includes a wavelength conversion layer as the surface light source.

(9)

The light-emitting device according to (8), further including a wavelength selection reflective film that selectively reflects the light outputted from the surface light source and transmits light in a wavelength band different from the wavelength band of the light.

(10)

The light-emitting device according to (9), in which the wavelength selection reflective film is provided on the wavelength conversion layer.

(11)

The light-emitting device according to (9), in which the wavelength selection reflective film is provided on a second surface of the reflecting structure, the second surface being on an opposite side to a first surface facing the light outputting surface of the light source section.

(12)

The light-emitting device according to any one of (1) to (11), in which the light source section further includes a light scattering layer disposed between the surface light source and the reflecting structure.

(13)

An image display apparatus including:
a plurality of light-emitting devices arranged in an array, in which
each of the plurality of light-emitting devices has:
a light source section including a surface light source;
a light reflective film that covers a surface of the light source section and has one or more openings on a light outputting surface of the light source section; and
a reflecting structure that is provided on side of the light outputting surface of the light source section and has one or more light reflecting surfaces around the one or more openings, the one or more light reflecting surfaces reflecting light outputted from the one or more openings in a predetermined direction.

(14)

The image display apparatus according to (13), in which light to be outputted from the plurality of light-emitting devices is each outputted in a mutually different direction.

(15)

The image display apparatus according to (14), in which the one or more openings of the plurality of light-emitting devices are formed at mutually different positions with respect to the light outputting surface.

(16)

The image display apparatus according to any one of (13) to (15), including, as the plurality of light-emitting devices, a first light-emitting device that has a light source section with a wavelength conversion layer between the surface light source and the reflecting structure; and a second light-emitting device that has a resin layer between the surface light source and the reflecting structure, the resin layer directly transmitting the light outputted from the surface light source.

This application claims priority based on Japanese Patent Application No. 2021-125301 filed on Jul. 30, 2021 with Japan Patent Office, the entire contents of which are incorporated in this application by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A light-emitting device, comprising:
a light source section that includes a surface light source and a light outputting surface;
a light reflective film configured to cover the light outputting surface, wherein
the light reflective film includes at least one opening on the light outputting surface, and
a position of the at least one opening is adjustable; and
a reflecting structure on the light reflective film and on a specific side of the light outputting surface, wherein
the reflecting structure includes at least one light reflecting surface,
the at least one light reflecting surface surrounds the at least one opening,
the at least one light reflecting surface is configured to reflect, in a specific direction, first light from the at least one opening, and
the specific direction is associated with the position of the at least one opening.

2. The light-emitting device according to claim 1, wherein the light reflective film is between the light outputting surface and the reflecting structure.

3. The light-emitting device according to claim 1, wherein an area of the at least one opening is less than or equal to 50% of an area of the surface light source.

4. The light-emitting device according to claim 1, wherein the reflecting structure further includes:
a first surface that faces the light outputting surface; and
a second surface opposite to the first surface,
the at least one light reflecting surface includes a concave portion that extends from the second surface to the first surface, and
a bottom face of the concave portion is open.

5. The light-emitting device according to claim 4, wherein a shape of the at least one light reflecting surface corresponds to a paraboloid of revolution.

6. The light-emitting device according to claim 4, wherein the concave portion comprises a resin layer, and the resin layer is optically transparent.

7. The light-emitting device according to claim 6, wherein the resin layer is on a side of the second surface, and a shape of the resin layer corresponds to a shape of a lens.

8. The light-emitting device according to claim 1, wherein the light source section further includes a wavelength conversion layer as the surface light source.

9. The light-emitting device according to claim 8, further comprising a wavelength selection reflective film configured to:
selectively reflect the first light from the surface light source; and
transmit second light in a wavelength band different from a wavelength band of the first light.

10. The light-emitting device according to claim 9, wherein the wavelength selection reflective film is on the wavelength conversion layer.

11. The light-emitting device according to claim 9, wherein
the reflecting structure includes a first surface and a second surface opposite to the first surface,
the first surface faces the light outputting surface, and
the wavelength selection reflective film is on the second surface.

12. The light-emitting device according to claim 1, wherein
the light source section further includes a light scattering layer, and
the light scattering layer is between the surface light source and the reflecting structure.

13. An image display apparatus, comprising:
a plurality of light-emitting devices in an array, wherein
each of the plurality of light-emitting devices includes:
a light source section that includes a surface light source and a light outputting surface;

a light reflective film configured to cover the light outputting surface, wherein
  the light reflective film includes at least one opening on the light outputting surface, and
  a position of the at least one opening is adjustable; and
a reflecting structure on the light reflective film and on a specific side of the light outputting surface, wherein
  the reflecting structure includes at least one light reflecting surface,
  the at least one light reflecting surface surrounds the at least one opening,
  the at least one light reflecting surface is configured to reflect, in a specific direction, first light from the at least one opening, and
  the specific direction is associated with the position of the at least one opening.

14. The image display apparatus according to claim 13, wherein each of the plurality of light-emitting devices is configured to emit second light in a mutually different direction.

15. The image display apparatus according to claim 14, wherein the at least one opening of the plurality of light-emitting devices is at a mutually different position with respect to the light outputting surface.

16. The image display apparatus according to claim 13, wherein each of the plurality of light-emitting devices further includes:
  a first light-emitting device that includes a light source section, wherein the first light-emitting device includes a wavelength conversion layer between the surface light source and the reflecting structure; and
  a second light-emitting device that includes a resin layer between the surface light source and the reflecting structure, wherein the resin layer is configured to directly transmit the first light.

* * * * *